United States Patent
Shih

(10) Patent No.: US 6,495,452 B1
(45) Date of Patent: Dec. 17, 2002

(54) METHOD TO REDUCE CAPACITANCE FOR COPPER INTERCONNECT STRUCTURES

(75) Inventor: Tsu Shih, Hsin-chu (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 09/376,425

(22) Filed: Aug. 18, 1999

(51) Int. Cl.$^7$ .............................................. H01L 21/4763
(52) U.S. Cl. ........................................ 438/643; 438/687
(58) Field of Search ................................. 438/622, 637, 438/639, 643, 687

(56) References Cited

U.S. PATENT DOCUMENTS

| | | | |
|---|---|---|---|
| 5,451,551 A | | 9/1995 | Krishnan et al. ............ 437/241 |
| 5,714,418 A | | 2/1998 | Bai et al. ..................... 438/627 |
| 5,741,626 A | | 4/1998 | Jain et al. .................... 430/314 |
| 5,744,376 A | | 4/1998 | Chan et al. .................. 437/190 |
| 5,808,335 A | * | 9/1998 | Sung ........................... 257/306 |
| 5,824,599 A | | 10/1998 | Schacham-Diamand et al. . 438/678 |
| 6,037,664 A | * | 3/2000 | Zhao et al. ................... 257/758 |
| 6,100,195 A | * | 8/2000 | Chan et al. .................. 438/687 |
| 6,114,238 A | * | 9/2000 | Liao ............................ 438/648 |
| 6,150,270 A | * | 11/2000 | Matsuda et al. ............. 438/687 |

OTHER PUBLICATIONS

"Introduction to Microelectronic Fabrication", vol. 5, Richard Jaeger, Addison—Wesley Publishing Company, Chapter 2. 1993.*

"VLSI Fabrication principles" S. K. Gandhi, John Wiley & sons, NY, pp. 542–548.*

* cited by examiner

*Primary Examiner*—Michael Sherry
*Assistant Examiner*—Asok Kumar Sarkar
(74) *Attorney, Agent, or Firm*—George O. Saile; Stephen B. Ackerman

(57) ABSTRACT

A process for creating a copper damascene structure, totally encapsulated with conductive barrier shapes, has been developed. After formation of a copper damascene structure, encased with tantalum or tantalum nitride barrier shapes, coating the bottom and sides of the copper damascene structure, another conductive barrier shape, is formed on the top surface of the copper damascene structure. This conductive barrier shape, located on the top surface of the copper damascene structure, is formed via patterning of a blanket conductive barrier layer, via an anisotropic RIE procedure, using a photoresist shape as an etch mask. The photoresist shape in turn, is formed in negative photoresist layer, using the same photolithographic exposure plate, previously used to define the opening in the insulator layer, in which the copper damascene structure resides. This combination results in a photoresist shape, directly overlying the portion of the conductive barrier layer that directly overlays the copper damascene structure, allowing a conductive barrier shape, to be formed only overlying the top surface of the copper damascene structure.

9 Claims, 3 Drawing Sheets

METHOD TO REDUCE CAPACITANCE FOR COPPER INTERCONNECT STRUCTURES

BACKGROUND OF THE INVENTION (1) Field of the Invention

The present invention relates to methods used to fabricate semiconductor devices, and more specifically to a method used to reduce the capacitance of semiconductor devices, comprised with copper interconnect structures.

(2) Description of Prior Art

The use of copper interconnect structures, has resulted in an increase in semiconductor device performance, when compared to counterparts fabricated using less conductive aluminum based, interconnect structures. However the use of dielectric barrier layers, such as a high dielectric constant silicon nitride layer, needed to prevent diffusion of copper, into, or poisoning of, overlying insulator layers, such as silicon oxide, have negated part of the performance increases resulting from the use of conductive copper structures. A blanket layer, of a high dielectric constant barrier layer, such as silicon nitride, is deposited after definition of the copper structure, and only removed from the region of the copper structure, to be used for contact by an overlying conductive structure. The remaining regions of the high dielectric constant silicon nitride layer, result in unwanted capacitances and decreased device performance.

This invention will describe a procedure in which a tantalum, or tantalum nitride, barrier layer, is used to prevent the interaction between the underlying copper interconnect structure, and an overlying insulator layer. However this invention will teach a process in which the barrier layer is patterned to remain only overlying the top surface of the underlying copper structure, removed from all other regions of the semiconductor device. The use of this novel procedure, using a photoresist shape as an etch mask for definition of the barrier layer shape, and where the photoresist shape is formed via exposure of a negative photoresist layer, using the same photomask that was previously used to create the damascene opening, in which the copper structure resides, allows creation of the barrier shape, overlying only the top surface of the copper structure, thus eliminating the need for a silicon nitride barrier layer, and thus resulting in reductions in capacitance, and increases in device performance. Prior art, such as Schacham-Diamand et al, in U.S. Pat. No. 5,824,599, and Bai et al, in U.S. Pat. No. 5,714,418, describe the use of silicon nitride barrier layers, for copper structures, while Chan et al, in U.S. Pat. No. 5.744,376, describes the use of either silicon nitride, aluminum oxide, or tantalum oxide barriers, for copper structures. However none of these prior arts describe the use of a conductive barrier layer, such as tantalum or tantalum nitride, defined overlying only the top surface of the underlying copper structure.

SUMMARY OF THE INVENTION

It is an object of this invention to fabricate a barrier layer, to prevent diffusion, or poisoning, from a underlying copper structure, to an overlying insulator layer.

It is another object of this invention to define a barrier layer shape, only on the top surface of the underlying copper structure.

It is still another object of this invention to create a tantalum or tantalum nitride barrier layer shape, only on the top surface of the underlying copper structure, via use of a reactive ion etching procedure, featuring the use a photoresist shape as an etch mask, where the photoresist shape is created using a negative photoresist material, and exposure using the same photomask that was previously used to define the opening, in an insulator layer, used for the damascene copper structure.

In accordance with the present invention a method is described for fabricating a damascene copper structure, featuring a conductive barrier layer, located only on the top surface of the damascene copper structure. An opening is made in a first insulator layer, using a first photomask, and a positive photoresist layer, exposing either a portion of the top surface of an underlying, lower interconnect structure, or a portion of the top surface of an active device region, in a semiconductor substrate, located at the bottom of the opening. After deposition of a first barrier layer, and of a copper layer, completely filling the opening in the first insulator layer, a chemical mechanical polishing, (CMP), procedure, is used to remove the regions of copper, and the regions of the first barrier layer, residing on the top surface of the first insulator layer, creating a damascene copper structure, in the opening in the first insulator layer. A second barrier layer, comprised of either tantalum or tantalum nitride is deposited, then defined overlying only the top surface of copper structure, via use of a reactive ion etching procedure, using a photoresist shape as a mask, where the photoresist mask was formed via exposure of a negative photoresist layer, using the first photomask. A second insulator layer is deposited, followed by the formation of a damascene, or dual damascene opening, in the second insulator layer, exposing a portion of the top surface of the second barrier layer, overlying the damascene copper structure. An upper metal interconnect structure is then formed in the opening in the second insulator layer, overlying, and contacting, a portion of the top surface of the second barrier layer.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1:
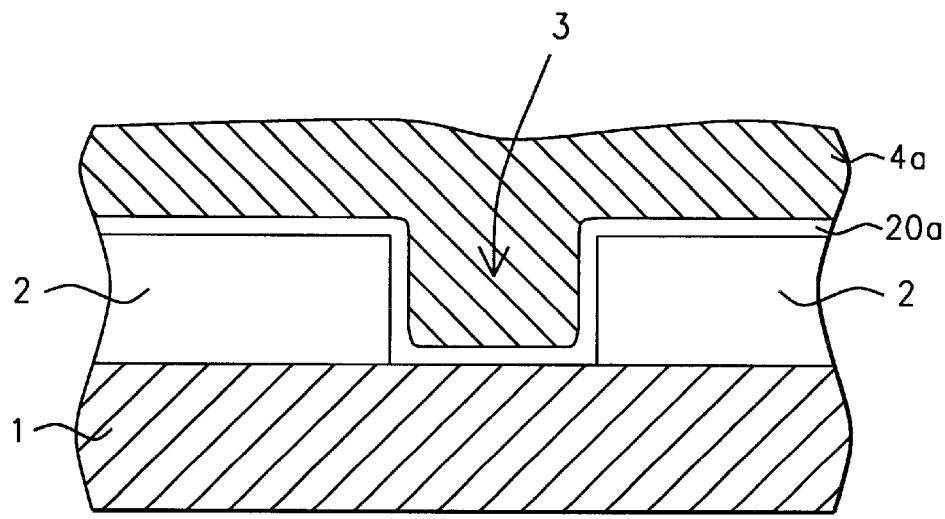
FIGS. 1–7, which schematically, in cross-sectional style, describe key stages of fabrication used to create a copper interconnect structure, comprised with a conductive barrier layer shape, overlying only the top surface of the copper structure.

The method of forming a damascene copper structure, encapsulated with a conductive barrier layer shapes, such as tantalum, or tantalum nitride, and featuring a conductive barrier shape, overlying only the top surface of the damascene copper structure, will now be described in detail. FIG. 1, schematically shows opening 3, in insulator layer 2, exposing a portion of the top surface of region 1. Region 1, can be an active device region, in a semiconductor substrate, such as a source/drain region, or region 1, can be a lower level, metal interconnect structure, comprised with a conductive material such as an aluminum based layer, a tungsten layer, or a metal silicide layer, such as tungsten silicide. Insulator layer 2, comprised of either silicon oxide, borophosphosilicate glass, (BPSG), or other low k dielectric oxides, is deposited on conductive region 1, via low pressure chemical vapor deposition, (LPCVD), or plasma enhanced chemical vapor deposition, (PECVD), procedures, at a thickness between about 3000 to 20000 Angstroms. Conventional photolithographic and reactive ion etching, (RIE), procedures, using $CHF_3$ as an etchant, are used to create opening 3, in insulator layer 2, exposing a portion of the top surface of conductive region 1, which again can be a lower level, metal interconnect structure, or an active device region, such as a source/drain region, in a semiconductor substrate. After removal of the photoresist shape, used for definition of opening 3, via plasma oxygen ashing and careful wet cleans, first barrier layer 20a, is deposited, via R.F. sputtering, or via chemical vapor deposition, (CVD), procedures, at a thickness between about 100 to 900 Angstroms. A barrier layer is needed to prevent copper diffusion from a subsequent copper structure, to insulator layer 2, or to prevent poisoning of conductive region 1, from a subsequent overlying copper structure. First barrier layer 20a, shown schematically in FIG. 1, located on the top surface of insulator layer 2, on the sides of opening 3, and on the portion of conductive region 1, exposed at the bottom of opening 3, can be either a tantalum layer, a tantalum nitride layer, or a titanium nitride layer. Copper layer 4a, is next deposited, via CVD procedures, at a thickness between about 5000 to 20000 Angstroms, completely filling opening 3. This is schematically shown in FIG. 1.

Figure 2:
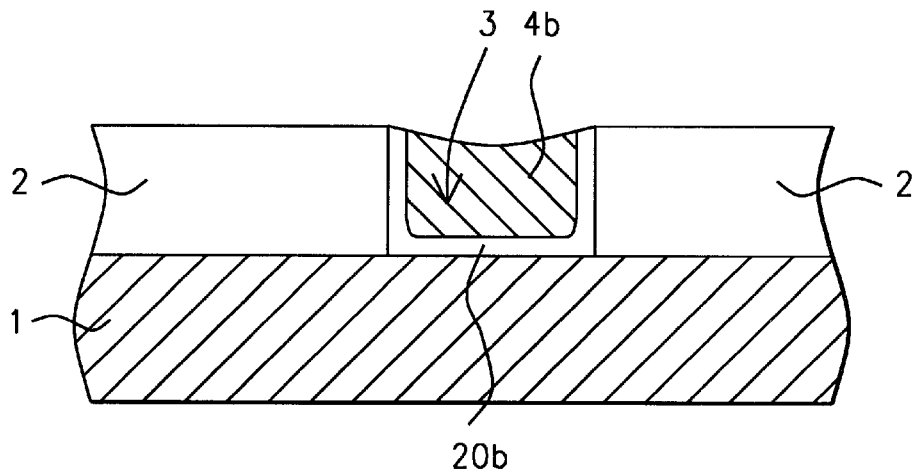

A chemical mechanical polishing, (CMP), procedure is next used to remove regions of copper layer 4a, and regions of first barrier layer 20a, from the top surface of insulator layer 2, creating copper damascene structure 4b, in opening 3, separated from insulator layer 2, and from conductive region 1, by first barrier shape 20b. This is schematically shown in FIG. 2. To insure complete removal of copper layer 4a, and first barrier layer 20a, from the top surface of insulator layer 2, an extended CMP cycle is used, resulting in the slight recessing, or dishing, of copper damascene structure, in opening 3.

In addition to preventing the effect of copper diffusion and poisoning, to adjacent regions, via the use of first barrier shape 20b, barrier protection is also required to prevent copper diffusion to subsequent overlying insulator layers. One solution has been to deposit a silicon nitride barrier layer, prior to deposition of an overlying insulator layer, followed by an opening made in the composite insulator layer, exposing a portion of the top surface of underlying, copper damascene structure 4b. That procedure however, results in the silicon nitride barrier layer, residing on a large area of insulator layer 2, and with the high dielectric constant inherent in silicon nitride, results in an unwanted increase in the RC component, degrading the performance of the device. Therefore a process designed to define a second barrier shape, only in a region directly overlying the copper damascene structure, is now described.

Figure 3:
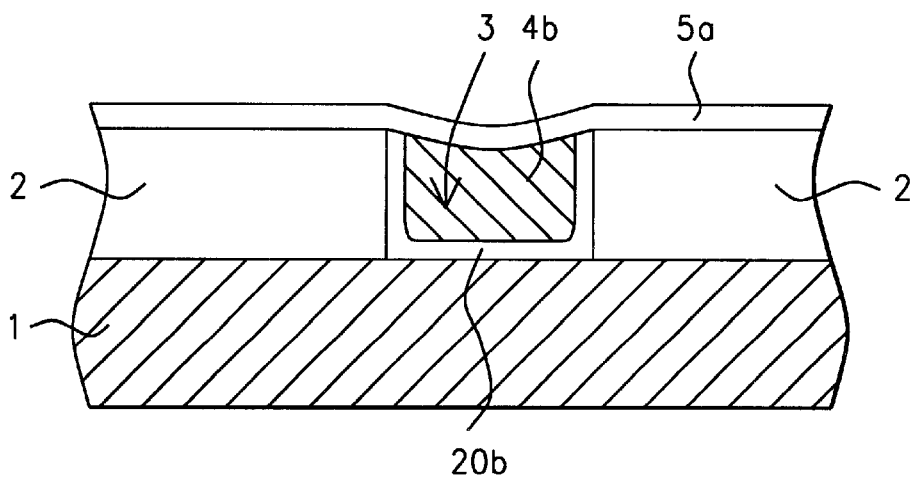
Figure 4:
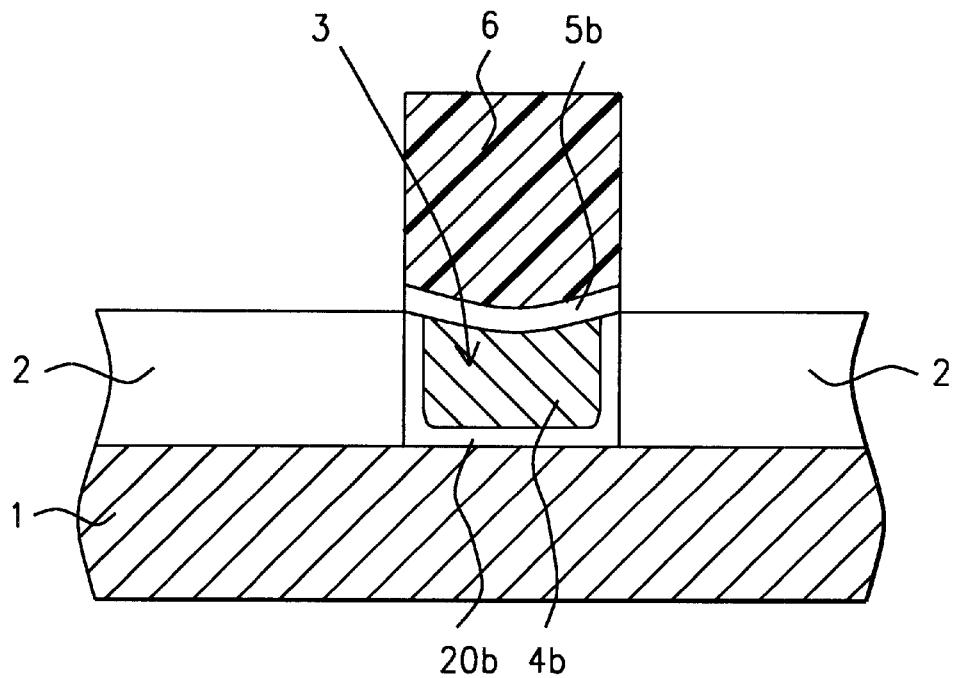

A second barrier layer 5a, comprised of either tantalum, or tantalum nitride, is deposited via R.F. sputtering, or CVD procedures, at a thickness between about 60 to 900 Angstroms. Second barrier layer 5a, shown schematically in FIG. 3, is located overlying, the top surface of insulator layer 2, as well as the top surface of copper damascene structure 4b. A negative photoresist layer is next applied, overlying second barrier layer 5a, followed by a photolithographic exposure procedure, using the identical photolithographic mask, previously used to define opening 3. Development of the unexposed regions of the negative photoresist layer, in an alkaline solution, result in the presence of exposed photoresist shape 6, directly overlying copper damascene structure 4b, and with a width identical to the width of opening 3. This is schematically shown in FIG. 4. Photoresist shape 6, is then used as an etch mask, allowing a selective RIE procedure, using $Cl_2$ or $SF_6$ as an etchant, to remove unprotected regions of second barrier layer 5a, resulting in the formation of second barrier shape 5b, schematically shown in FIG. 4. Copper damascene structure 4b, is now encapsulated by first barrier shape 20b, and by second barrier shape 5b, preventing possible interaction between copper and adjacent materials, without the use of a more global, performance degrading, silicon nitride barrier.

Figure 5:
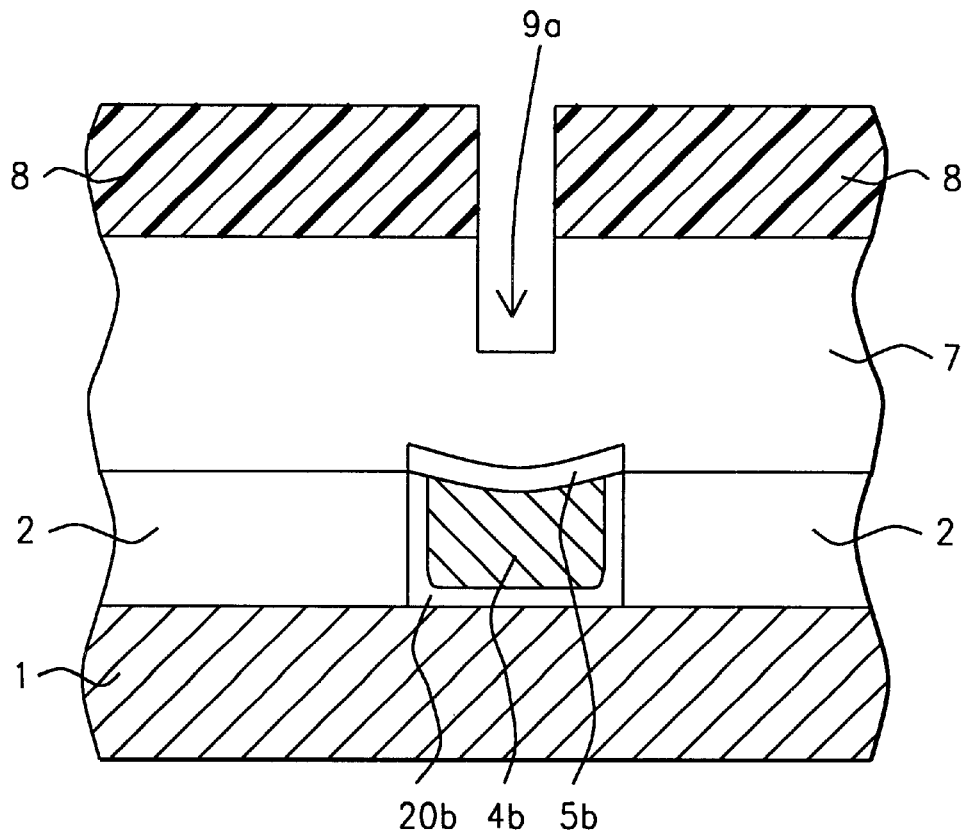
Figure 6:
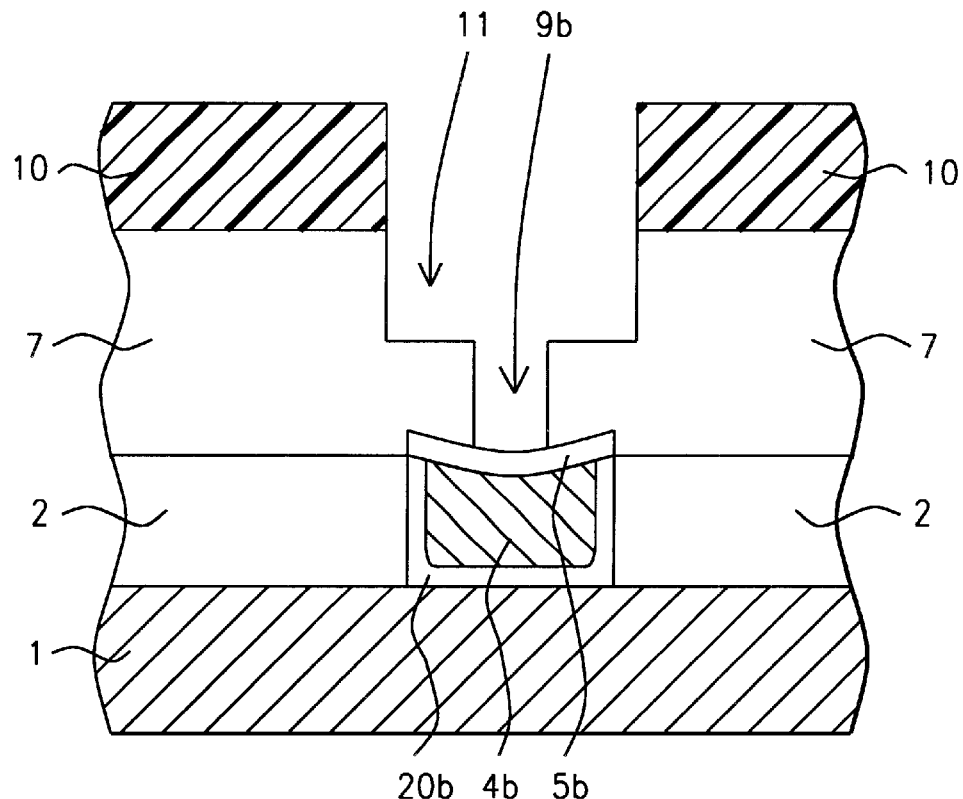

FIGS. 5–6, schematically show the creation of a dual damascene opening in an insulator layer, exposing a portion of the top surface of second barrier shape 5b. This invention will be described using a dual damascene opening, created via initial formation of a narrow diameter opening, in a top portion of an insulator layer, followed by the creation of the wide diameter opening, in the top portion of the insulator layer, resulting in the transfer of the narrow diameter opening, to the lower portion of the insulator layer. However if desired the dual damascene opening can be formed by initially forming the wide diameter component, in the top portion of an insulator layer, followed by the creation of the narrow diameter component, of the dual damascene opening, in the bottom portion of the insulator layer.

After removal of photoresist shape 6, via plasma oxygen ashing and careful wet cleans, insulator layer 7, comprised of silicon oxide, or BPSG, is deposited via PECVD procedures, to a thickness between about 3000 to 20000 Angstroms. Photoresist shape 8, is then used as a mask, allowing narrow diameter opening 9a, to be formed in a top portion of insulator layer 7, via an anisotropic RIE procedure, using $CHF_3$ as an etchant. Narrow diameter opening 9a, schematically shown in FIG. 5, has a diameter between about 0.20 to 0.30 um. After removal of photoresist shape 8, via plasma oxygen ashing and careful wet cleans, photoresist shape 10, is formed, and used as an etch mask, allowing another anisotropic RIE procedure, again using $CHF_3$ as an etchant, to create wide diameter opening 11, in the top portion of insulator layer 7. The RIE procedure used to create wide diameter opening 11, with a diameter between about 0.30 to 0.40 um, results in the transfer of narrow diameter opening 9a, from the top portion of insulator layer 7, to the bottom potion of insulator layer 7, resulting in narrow diameter opening 9b, exposing a top portion of second barrier shape 5b. The dual damascene opening, in insulator layer 7, comprised of overlying wide diameter component 11, and underlying, narrow diameter component 9b, is schematically shown in FIG. 6.

Figure 7:
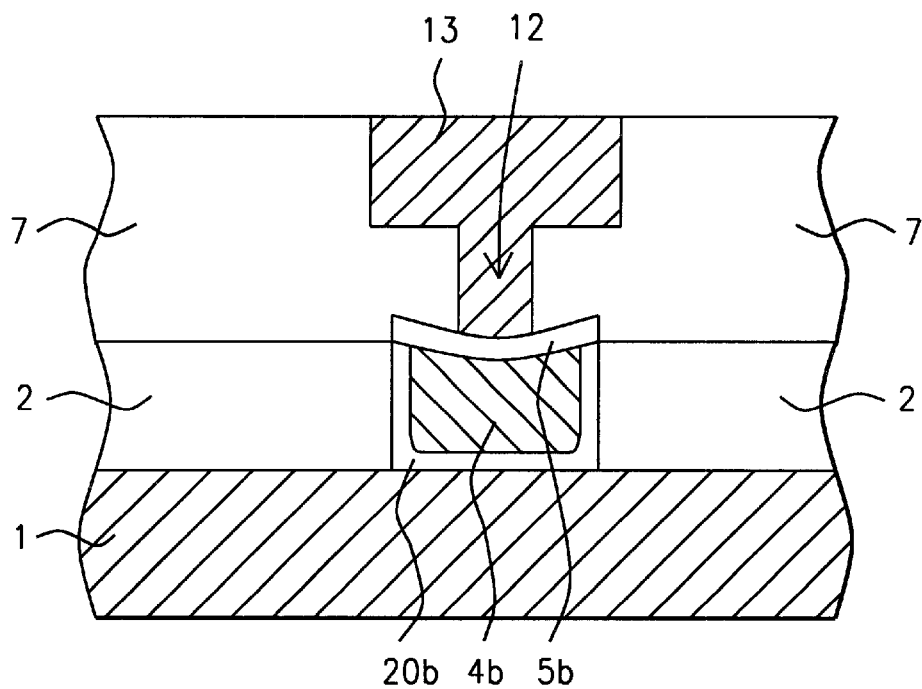

After removal of photoresist shape 10, again using plasma oxygen and careful wet cleans, a metal layer is deposited, completely filling the dual damascene opening 12, in insulator layer 7. The metal layer can again be comprised of copper in which the barrier layers, described with copper damascene structure 4b, would again be employed, or the metal layer can be a aluminum based layer. If a damascene type, upper level metal structure is desired, a CMP procedure is used to remove the regions of the metal layer, overlying insulator layer 7, resulting in metal structure 13, in the dual damascene opening 12. This is shown schematically in FIG. 7. If desired, photolithographic and RIE procedures can be used to create an upper level metal structure with a first portion residing in dual damascene opening 12, while a second portion of the upper metal structure overlays a region of the top surface of insulator layer 7. Metal structure 13, communicates with copper damascene structure 4b, via contact to conductive, second barrier shape 5b, which in turn overlays only the top surface of copper damascene structure 4b, and therefore eliminates the capacitance increase encountered with a more global type, silicon nitride barrier shape.

While this invention has been particularly shown and described with reference to, the preferred embodiments thereof, it will be understood by those skilled in the art that various changes in form and details may be made without departing from the spirit or scope of this invention.

What is claimed is:

1. A method of fabricating a copper damascene structure, on a semiconductor substrate, in which the copper damascene structure is encapsulated by conductive barrier layers, and with a tantalum nitride barrier shape which directly overlays said copper damascene structure, defined using identical photolithographic mask used to define the opening said copper damascene structure, comprising the steps of:

depositing a first insulator layer, on an underlying conductive active device region, in said semiconductor substrate, or an underlying metal structure, forming an opening in a positive photoresist layer, via development of a region of said positive photoresist layer, exposed through an opening in a first photolithographic exposure plate;

performing a first anisotropic reactive ion etching procedure, using said opening in said positive photoresist layer as a mask, to create a first opening, in said first insulator layer, exposing a portion of the top surface of said underlying conductive active device region, depositing a first conductive barrier layer on the top surface of said first insulator layer, on the sides of said first opening, and on the portion of said underlying conductive active device region, exposed at the bottom of said first opening;

depositing a copper layer on said first conductive barrier layer, completely filling said first opening;

performing a chemical mechanical polishing procedure, removing the regions of said copper layer, and the regions of said first conductive barrier layer, which overlay the top surface of said first insulator layer, creating a copper damascene structure, in said first opening, with said copper damascene structure partially encapsulated with first conductive barrier shapes;

depositing a blanket tantalum nitride layer;

applying a negative photoresist layer, using said first photolithographic exposure plate as a mask to expose the portion of said negative photoresist layer, exposed in an opening, in said first photolithographic exposure plate;

forming a photoresist shape via development of non-exposed regions of said negative photoresist layer, with said photoresist shape overlying a region of said blanket tantalum nitride layer, which directly overlays partially encapsulated, copper damascene structure;

performing a second anisotropic reactive ion etching procedure, to remove regions of said blanket tantalum nitride layer, not protected by said photoresist shape, creating a fully encapsulated, copper damascene structure, comprised with a top surface encapsulated by overlying said tantalum nitride barrier shape, and with said first conductive barrier shapes, located on the sides, and located underlying, said copper damascene structure;

depositing a second insulator layer, forming a dual damascene opening in said second insulator layer, exposing a portion of said tantalum nitride barrier shape, located at the bottom of said dual damascene opening, depositing a metal layer, completely filling said dual damascene opening; and patterning of said metal layer to create an upper level metal interconnect structure.

2. The method of claim 1, wherein said first insulator layer is either a silicon oxide layer, a borophosphosilicate layer, or a low k dielectric oxide layer, obtained via LPCVD or PECVD procedures, at a thickness between about 3000 to 20000 Angstroms.

3. The method of claim 1, wherein said first anisotropic reactive ion etching procedure, used to create said first opening, in said first insulator layer, is performed using $CHF_3$ as an etchant.

4. The method of claim 1, wherein said first conductive barrier layer is comprised of tantalum, or tantalum nitride, obtained via R.F. sputtering, or CVD procedures, at a thickness between about 100 to 900 Angstroms.

5. The method of claim 1, wherein said copper layer is obtained via CVD procedures, at a thickness between about 5000 to 20000 Angstroms.

6. The method of claim 1, wherein said blanket tantalum nitride layer is obtained via R.F. sputtering, or via CVD procedures, at a thickness between about 60 to 900 Angstroms.

7. The method of claim 1, wherein said second anisotropic reactive ion etching procedure, used to remove the regions of said blanket tantalum nitride layer, not covered by said photoresist shape, is performed using $Cl_2$ or $SF_6$ as an etchant.

8. The method of claim 1, wherein said second insulator layer is a silicon oxide, or a borophosphosilicate layer, obtained via PECVD procedures, at a thickness between about 3000 to 20000 Angstroms.

9. The method of claim 1, wherein said dual damascene opening, in said second insulator layer, is formed via an anisotropic reactive ion etching procedure, using $CHF_3$ as an etchant.

* * * * *